United States Patent
Takeishi

(10) Patent No.: US 6,853,409 B2
(45) Date of Patent: Feb. 8, 2005

(54) SIGNAL PROCESSING CIRCUIT BOARD AND LIQUID CRYSTAL DISPLAY APPARATUS WITH VARIABLE RESISTOR WHICH ARE HARDLY DECLINED IN THE MECHANICAL STRENGTH WHILE ITS VARIABLE RESISTOR IS NOT LIMITED TO ONE PARTICULAR LOCATION FOR THE INSTALLATION

(76) Inventor: Yutaka Takeishi, c/o NEC Corporation, 7-1, Shiba 5-chome, Minato-ku, Tokyo (JP)

(*) Notice: Subject to any disclaimer, the term of this patent is extended or adjusted under 35 U.S.C. 154(b) by 443 days.

(21) Appl. No.: 09/739,236

(22) Filed: Dec. 19, 2000

(65) Prior Publication Data

US 2001/0005240 A1 Jun. 28, 2001

(30) Foreign Application Priority Data

Dec. 22, 1999 (JP) .......................................... 11/365178

(51) Int. Cl.$^7$ ............................................ G02F 1/1333
(52) U.S. Cl. ........................................................ 349/58
(58) Field of Search ............................................ 349/58

(56) References Cited

U.S. PATENT DOCUMENTS 4,652,932 A * 3/1987 Miyajima et al. ............ 348/794

FOREIGN PATENT DOCUMENTS

| JP | 55-167648 | 5/1954 | |
| JP | U 63-33657 | 3/1988 | |
| JP | A 3-116898 | 5/1991 | |
| JP | 403116898 | * 5/1991 | ................. 361/767 |
| JP | U 5-1203 | 1/1993 | |
| JP | U 5-41101 | 6/1993 | |
| JP | A 9-146072 | 6/1997 | |

* cited by examiner

Primary Examiner—Robert H. Kim
Assistant Examiner—P. R. Akkapeddi

(57) ABSTRACT

A signal processing circuit board includes a board body, a variable electronic element, and a hole. The variable electronic element is mounted in a mounting side of the board body. The variable electronic element has an operating member to control an output outputted from the variable electronic element in a single side of the variable electronic element. The hole is provided in the board body. The operating member is positioned in the hole such that the operating member points in the other side opposite to the mounting side of the board body.

20 Claims, 11 Drawing Sheets

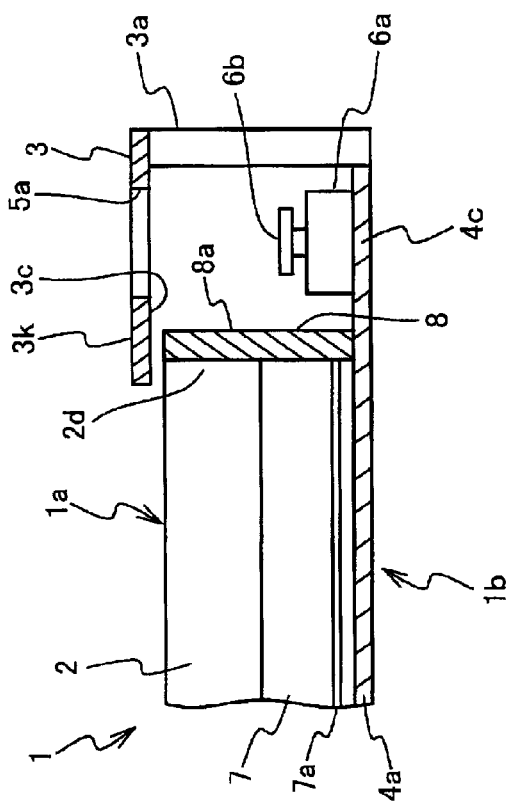
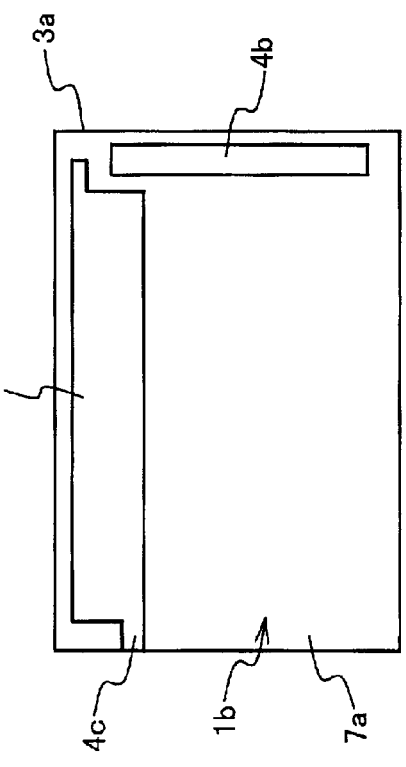
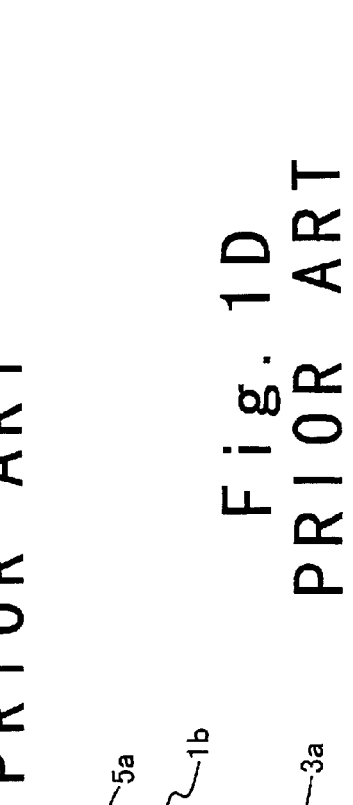
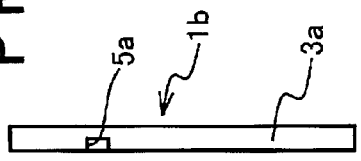
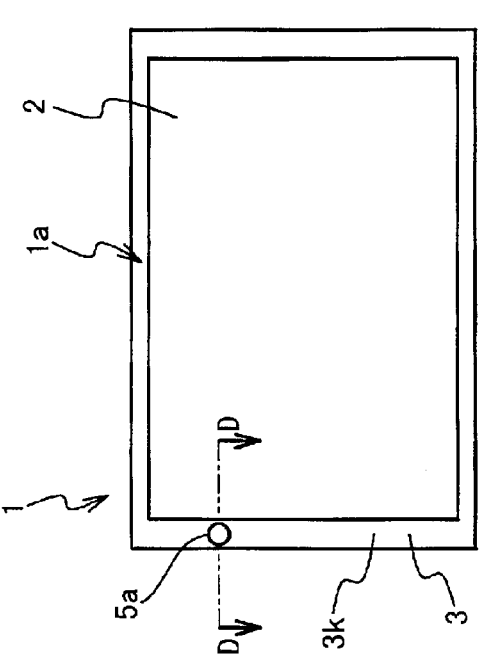

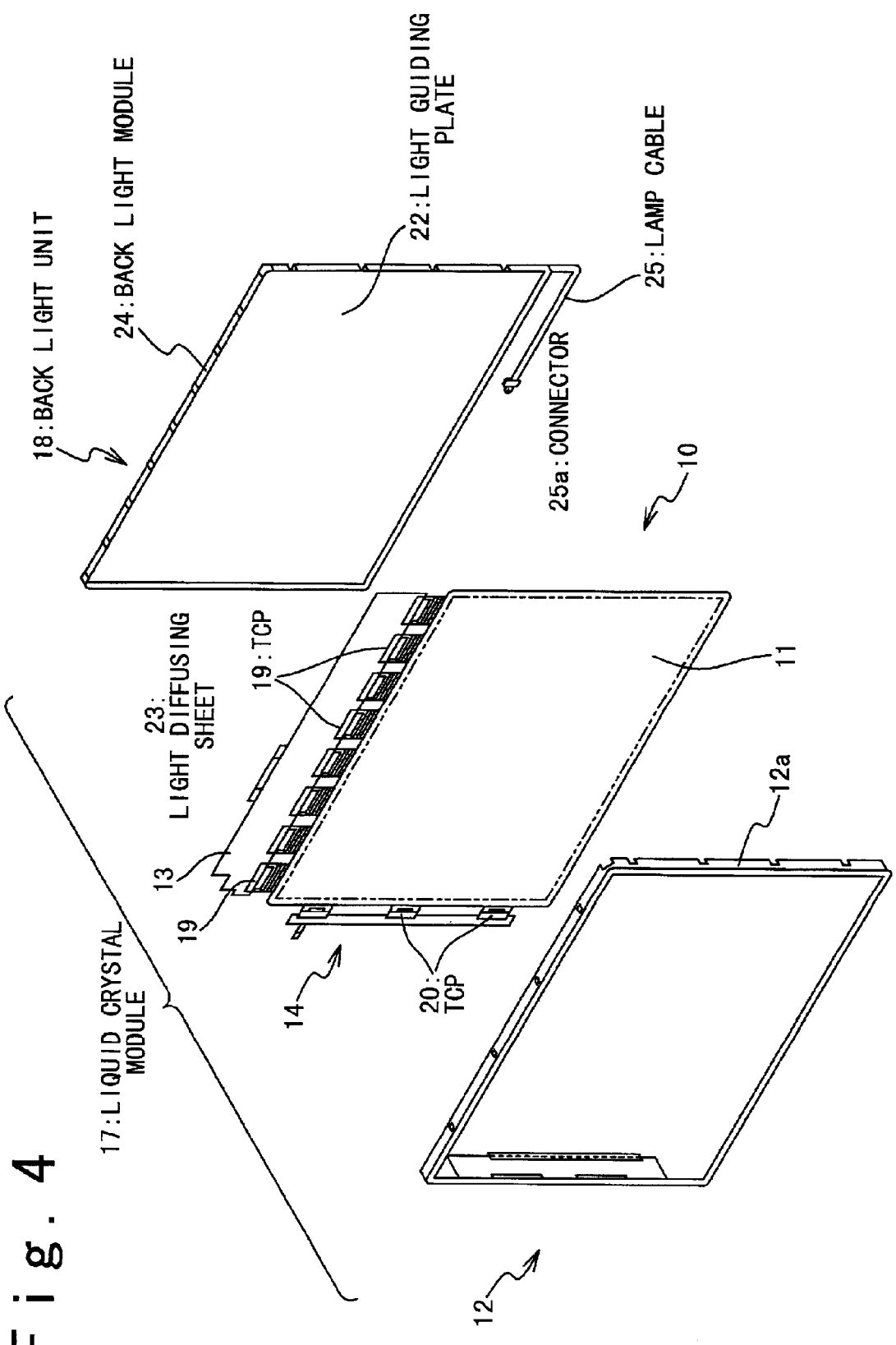

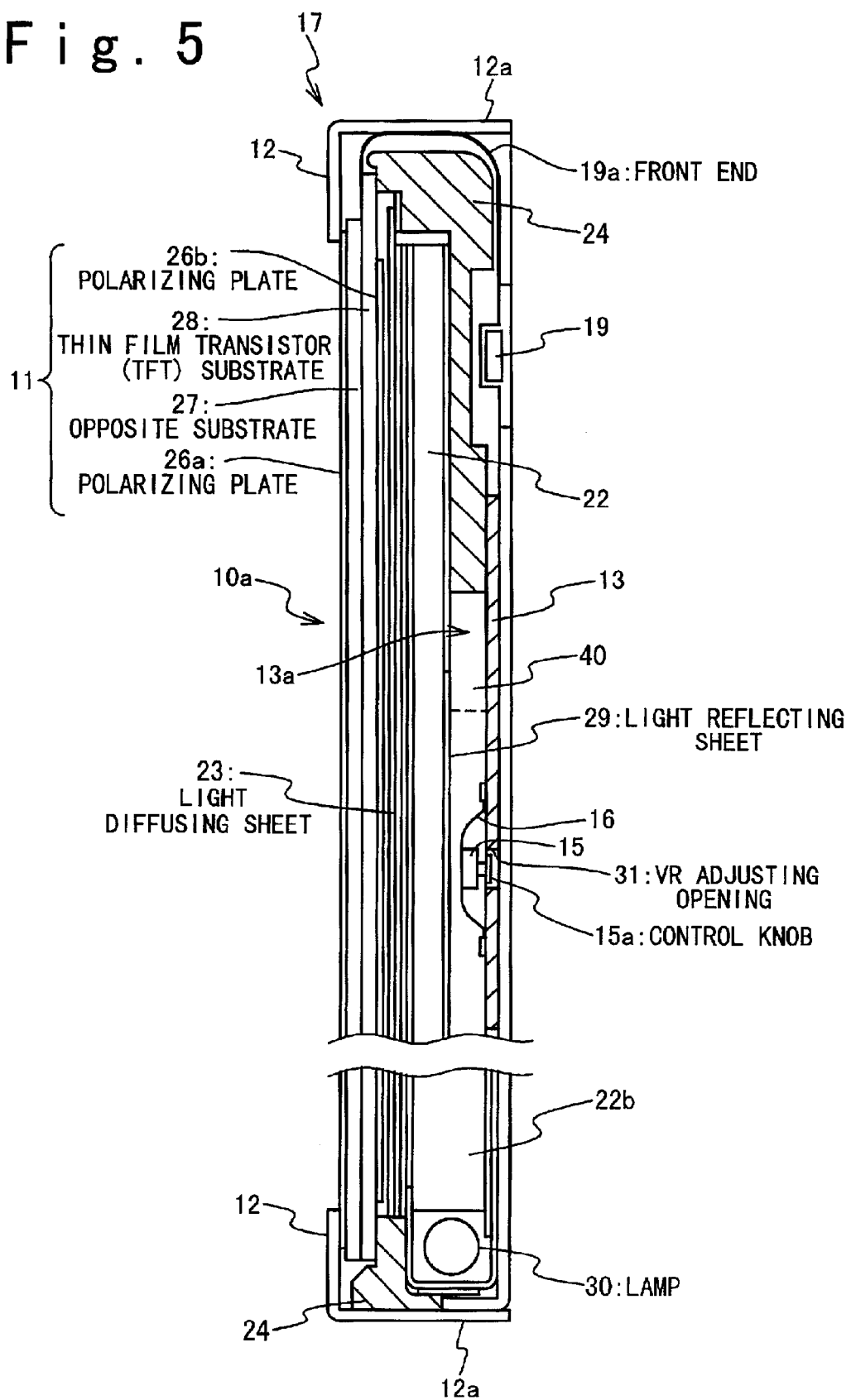

SIGNAL PROCESSING CIRCUIT BOARD AND LIQUID CRYSTAL DISPLAY APPARATUS WITH VARIABLE RESISTOR WHICH ARE HARDLY DECLINED IN THE MECHANICAL STRENGTH WHILE ITS VARIABLE RESISTOR IS NOT LIMITED TO ONE PARTICULAR LOCATION FOR THE INSTALLATION

BACKGROUND OF THE INVENTION

1. Field of the Invention

The present invention relates to a signal processing circuit board and a liquid crystal display apparatus and particularly to a signal processing circuit board and a liquid crystal display apparatus equipped with a variable resistor which has a control knob.

2. Description of the Related Art

A signal processing circuit board has been proposed which has a variable resistor (referred to as VR hereinafter) mounted thereon for adjusting the supply potential to an optimum level. For example, such signal processing circuit boards are installed in a liquid crystal panel used as the liquid crystal display (LCD) of a notebook computer or the like.

FIG. 1A is a front view of a liquid crystal panel unit employing a conventional signal processing circuit board. FIG. 1B is a back view and FIG. 1C is a side view of the same. FIG. 1D is a cross sectional view taken along the line D—D of FIG. 1A.

As shown in FIGS. 1A to 1D, the liquid crystal panel unit 1 has a liquid crystal panel 2 of a rectangular plate shape mounted on a front side 1a thereof and a (front) shield sheet 3 of a frame form exposed on the outer edge of the liquid crystal panel 2. The liquid crystal unit 1 also has a pair of signal processing circuit boards 4a and 4b (two printed circuit boards) mounted along a horizontal edge and a vertical edge respectively on a back side 1b thereof. The signal processing circuit board 4a is designed for applying a data signal to each pixel of the liquid crystal panel 2 while the signal processing circuit board 4b is designed for applying a horizontal scan signal to each pixel of the liquid crystal panel 2.

As shown in FIG. 1D, the shield plate 3 is made of a frame-like metal plate having an L shape in cross section. The shield plate 3 has an upright wall 3a thereof which extends along the outer edge of the liquid crystal panel 2 to determine an outer edge of the crystal panel unit 1. As best shown in FIGS. 1A and 1D, the shield plate 3 has a VR adjustable aperture 5a provided in a vertical side 3k thereof and communicated with a notch in the upright wall 3a. As shown in FIGS. 1A, 1B, and 1D, the signal processing circuit board 4a has a VR mounted extension 4c extending from a side thereof. A VR 6a of single-side controllable type is mounted on the mounting side of the VR mounting extension 4c (the front side 1a of the liquid crystal panel unit 1) for adjusting the supply potential to an optimum level.

As shown in FIG. 1D, a light guiding plate 7 is disposed on the back side of the liquid crystal panel 2 have a layers structure. The liquid crystal panel 2 is accommodated with the light guiding plate 7 in a frame-shaped back light chassis 8. A light reflecting sheet 7a is bonded to the back side of the light guiding plate 7 covering the entire surface. As the back light chassis 8 is inserted beneath the back side 3c of the shield plate 3, the outer edge 2d of the liquid crystal panel 2 is protected with the shield plate 3. There is provided a space for the VR 6a between the outer side 8a of the back light chassis 8 and the upright wall 3a of the shield plate 3.

As described, the VR 6a of single-side controllable type is mounted with its control knob 6b at the upper on the mounting side of the VR mounting extension 4c which extends from the side of the signal processing circuit board 4a.

In action, the single-side control VR 6a of single-side (one-side) controllable type can be adjusted to a desired setting of resistance with its control knob 6b turned by an adjusting tool, such as a screwdriver, inserted into the VR adjusting aperture 5a in the shield plate 3. Using the VR 6a of single-side controllable type, the supply potential can be adjusted to an optimum level from the front side 1a of the liquid crystal panel unit 1.

The VR adjustment has to be conducted for each AC driven crystal panel to set the driving voltage to a desired level. If the adjustment is inadequate, the panel may exhibit flickers, burns, or other visual irregularities.

FIG. 2A is a front view of another liquid crystal panel unit employing a conventional signal processing circuit board. FIG. 2B is a back view and FIG. 2C is a side view of the same. FIG. 2D is a cross sectional view taken along the line E—E of FIG. 2B. FIG. 2E is an enlarged view of a VR mounting extension.

As shown in FIG. 2D, the liquid crystal panel unit 9 has a VR 6d of double-side controllable type, not single-side type 6a, mounted thereon with its control knob 6c exposed from the back side of the signal processing circuit board 4a As shown in FIGS. 2B and 2D, the VR aperture 5a provided in the shield plate 3 is replaced by a VR adjusting aperture 5b provided in the signal processing circuit board 4a on which the VR 6d is mounted so that the control knob 6c is exposed from the back side of the signal processing circuit board 4a (opposite to the components mounting side). The other arrangement and functions of this model is identical to the liquid crystal panel unit 1 (FIG. 1).

In action, the VR 6d of double-side controllable type can be adjusted to a desired setting of resistance with its control knob 6c turned by an adjusting tool, such as a screwdriver, inserted into the VR adjusting aperture 5b in the signal processing circuit board 4. Using the VR 6d of double-side controllable type, the supply potential can be adjusted to an optimum level from the back side 9b of the liquid crystal panel unit 9.

As the liquid crystal panel units 1 and 9 are reduced in the thickness and the peripheral marginal area, their structure holds a larger area for display hence matching the down sizing and the light weighing of notebook computers with the liquid crystal display. It is now feasible that, for example, the thickness is less than 8 mm while the effective pixel area covers substantially 90% of the entire panel surface. It is essential that since the VR 6a or 6b is controlled by visual manipulation with the signal processing circuit board 4a mounted to the liquid crystal panel 2, its control knob 6a or 6d is exposed from the front side 1a or the back side 1b of the liquid crystal panel unit 1.

However, the VR 6a of single-side controllable type which has a height of about 1 mm and is lower than the VR 6d of double-side controllable type of about 1.5 mm in height is suitable for minimizing the thickness but has to have the VR adjusting aperture 5a provided in the shield plate 3 (See FIG. 1D).

After the signal processing circuit board 4a is assembled with its VR mounting side (the components mounting side)

to face the back side of the liquid crystal panel 2, the VR 6a has to be adjusted through viewing the display side of the liquid crystal panel 2. For exposing the control knob 6b of the VR 6a to be adjusted, the VR 6a is shifted to the mounting location outside the liquid crystal panel 2 or beneath the shield plate 3 before the aperture 5a is provided in the shield plate 3.

Also, since the distance between the back side of the liquid crystal panel 2 and the upper center side of the signal processing circuit board 4a is smaller than 1.5 mm (which is equal to the height of the VR 6d), the VR 6d of double-side controllable type is hardly located in substantially a center region of the signal processing circuit board 4a This allows the VR 6d of double-side controllable type to be located only beneath the shield plate 3 where there is provided a sufficient room (See FIGS. 2B and 2D).

As the shield plate 3 has the VR adjusting aperture 5a provided therein, the physical strength of its metal material may be declined. Also, as the VR is located at the edge of the signal processing circuit board 4a and the room for its installation is preserved in the limited space beneath the back side of the shield plate 3 (FIGS. 1D and 2D), the back light chassis 8 has to be reduced in the thickness thus declining the physical strength. This is a critical condition when the shield plate 3 of the frame-narrowed structure is minimized in the frame width to provide a generous size of the effective pixel area.

For avoiding the drilling of the shield plate 3 or the thinning of the back light chassis 8, it is desirable to locate the VR beneath the back side of the liquid crystal panel 2. There is no room (depth) for installation of the VR between the signal processing circuit board 4a and the light guiding plate 7 bonded on the back side of the liquid crystal panel 2. Preserving any room for installation of the VR between the two members involves reducing the thickness of the liquid crystal panel 2. As the reduction of the thickness may degrade the optical characteristics the liquid crystal panel 2, it is impossible to develop any room. The VR has to stay beneath the shield plate 3.

Since the control knob 6c of the VR 6d of double-side controllable type is exposed from the back side of the signal processing circuit board 4a it can readily be accessed by the adjusting tool without difficulty. The VR 6a of single-side controllable type is accessed by the adjusting tool inserting deeply through the VR adjusting aperture 5a and may be injured when being groped by the tip of the adjusting tool.

Accordingly, as the conventional liquid crystal panel units 1 and 9 are limited in the installation of the VR, they may be declined in the physical strength and injured at the VR during the assembling process.

SUMMARY OF THE INVENTION

The present invention is accomplished in view of the above mentioned problems. Therefore, an object of the present invention is to provide a signal processing circuit board and a liquid crystal display apparatus which are hardly declined in the mechanical strength while its variable resistor is not limited to one particular location for the installation but successfully inhibited from being injured during the assembling process.

In order to achieve an aspect of the present invention, a signal processing circuit board, includes a board body; a variable electronic element mounted in a mounting side of the board body, the variable electronic element having an operating member to control an output outputted from the variable electronic element in a single side of the variable electronic element; and a hole provided in the board body, and wherein the operating member is positioned in the hole such that the operating member points in the other side opposite to the mounting side of the board body.

In this case, the variable electronic element has the operating member in only the single side of the variable electronic element.

Also in this case, the variable electronic element is a variable resistor.

Further in this case, the variable electronic element is a variable capacitor.

In this case, the operating member does not project from the other side.

Also in this case, the variable electronic element is mounted through an attachment member electronically and mechanically connected to the mounting side.

Further in this case, the attachment member is a flexible printed circuit connected to the mounting side to cover the hole.

In this case, the flexible printed circuit is soldered to the mounting side in a substantially center position of one end of the flexible printed circuit and two different locations of the other end of the flexible printed circuit respectively which are equally spaced from the center position of the same.

Also in this case, the variable electronic element is floated on the flexible printed circuit.

Further in this case, the flexible printed circuit has a flexibility to protect the variable electronic element from mechanical stress.

In this case, the attachment member includes a strip on which the variable electronic element is mounted and a supporting member to attach to the mounting side.

Also in this case, the supporting member includes one of a conductive bump and a conductive pin.

Further in this case, the attachment member includes a recessed block having a recess in which the variable electronic element is mounted.

In this case, the recessed block is formed of a single board.

Also in this case, the recessed block is formed of a number of layers.

In order to achieve another aspect of the present invention, a liquid crystal display apparatus controlling method, includes: providing a liquid crystal display screen; providing a board used for the liquid crystal display screen; providing a variable electronic element mounted in a mounting side of the board, the variable electronic element having an operating member to control an output outputted from the variable electronic element in a single side of the variable electronic element; forming a hole in the board: positioning the operating member in the hole such that the operating member points in the other side opposite to the mounting side of the board, the other side being opposite to the liquid crystal display screen; displaying an image on the liquid crystal display screen; and operating the operating member through the hole from the other side while viewing the image.

In this case, the operating member does not project from the other side.

Also in this case, the variable electronic element is mounted through a flexible printed circuit electronically and mechanically connected to the mounting side.

Further in this case, the flexible printed circuit covers the hole.

In this case, the variable electronic element is floated on the flexible printed circuit.

Also in this case, the flexible printed circuit has a flexibility to protect the variable electronic element from mechanical stress when the operating member is operated such that the mechanical stress is not applied to the liquid crystal display screen.

Further in this case, the variable electronic element is provided to overlap with the liquid crystal display screen.

In order to achieve still another aspect of the present invention, a liquid crystal display apparatus, includes a signal processing circuit board; and a liquid crystal display screen electronically connected to the signal processing circuit board, an image being displayed on a displaying side of the liquid crystal display screen, and wherein the signal processing circuit board includes: a board body; a variable electronic element mounted in a mounting side of the board body, the variable electronic element having an operating member to control an output outputted from the variable electronic element in a single side of the variable electronic element; and a hole provided in the board body, and wherein the operating member is positioned in the hole such that the operating member points in the other side opposite to the mounting side of the board body, and wherein the variable electronic element is provided in a opposed side opposed to the displaying side of the liquid crystal display screen such that the operating member is exposed in the opposed side through the hole.

In this case, the variable electronic element is mounted through an attachment member electronically and mechanically connected to the mounting side.

Also in this case, the attachment member is a flexible printed circuit connected to the mounting side to cover the hole.

Further in this case, the attachment member includes a strip on which the variable electronic element is mounted and a supporting member to attach to the mounting side.

In this case, the attachment member includes a recessed block having a recess in which the variable electronic element is mounted.

According to the present invention, a variable resistor of single-side controllable type having a control knob thereof on single side is mounted on the components mounting side of a signal processing circuit board with its control knob locating in an adjusting aperture provided in the signal processing circuit board to open at the components mounting side and simultaneously facing in a direction opposite to the components mounting side. This allows the variable resistor installed in a liquid crystal display panel of a thin, frame-narrowed structure to be mounted at a proper location without unnecessary limitation and protected from being injured during the assembling process without declining the mechanical strength.

A liquid crystal display apparatus of the present invention can be implemented using the signal processing circuit board described above.

BRIEF DESCRIPTION OF THE DRAWINGS

FIG. 1A is a front view showing a liquid crystal panel unit employing a conventional signal processing circuit board;

FIG. 1B is a back view showing the liquid crystal panel unit employing the conventional signal processing circuit board;

FIG. 1C is a side view showing the liquid crystal panel unit employing the conventional signal processing circuit board;

FIG. 1D is a cross sectional view taken along the line D—D of FIG. 1A;

FIG. 4 is an exploded view of a liquid; crystal display module including the liquid crystal panel unit shown in FIGS. 3A to 3C;

FIG. 5 is a longitudinally cross sectional view showing an internal arrangement of the liquid crystal display module shown in FIG. 4;

DESCRIPTION OF THE PREFERRED EMBODIMENTS

Preferred embodiments of the present invention will be described referring to the relevant drawings.

Figure 3A:
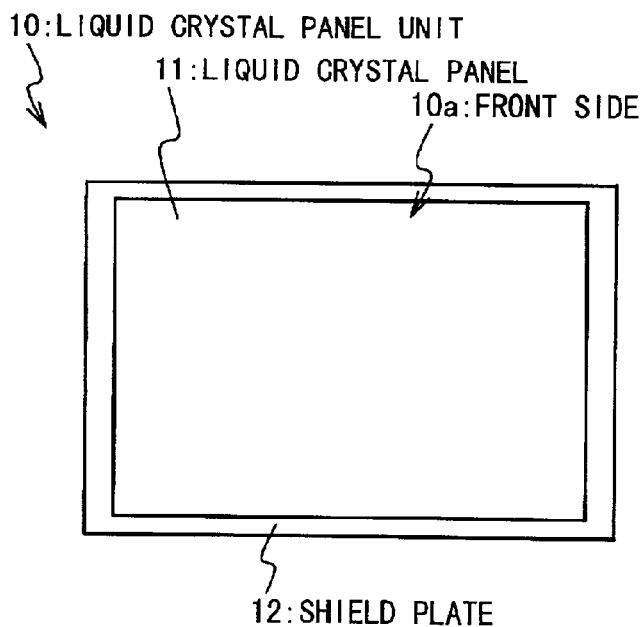
FIG. 3A is a front view showing a liquid crystal panel unit employing a signal processing circuit board according to an embodiment of the present invention.
Figure 3C:
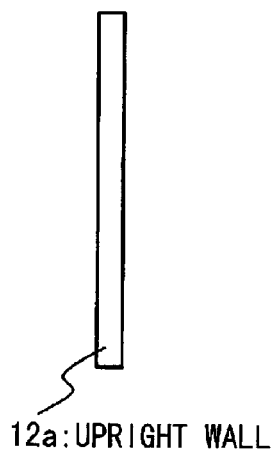
FIG. 3C is a side view showing the liquid crystal panel unit employing the signal processing circuit board according to the embodiment of the present invention.
Figure 3B:
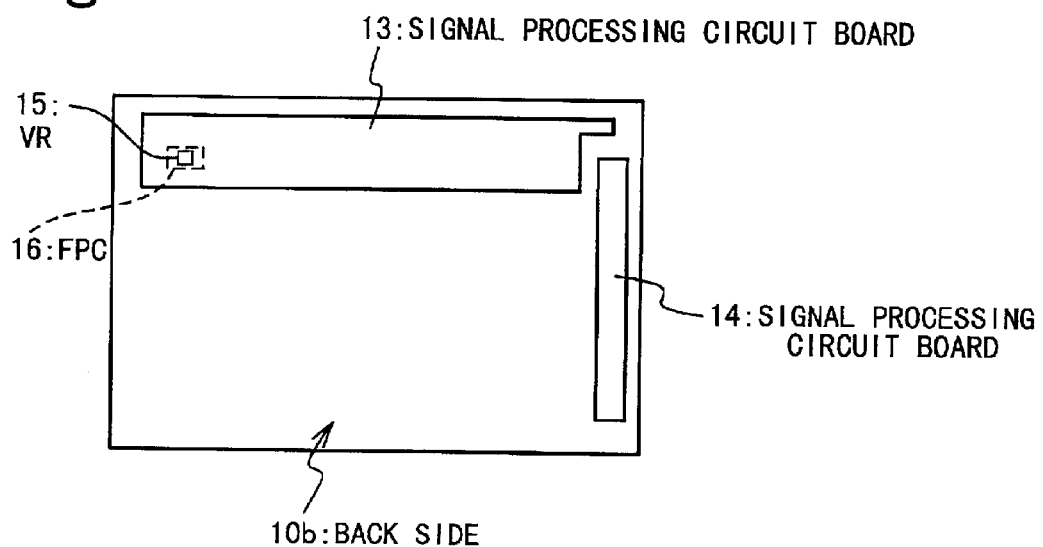
FIG. 3B is a back view showing the liquid crystal panel unit employing the signal processing circuit board according to the embodiment of the present invention.

FIG. 3A is a front view of a liquid crystal panel unit including a signal processing circuit board according to an embodiment of the present invention. FIG. 3B is a back view and FIG. 3C is a side view of the same.

As shown in FIGS. 3A and 3B, the liquid crystal (LC) panel unit 10 has a liquid crystal panel 11 of a rectangular shape and a (front) shield plate 12 of a frame-like shape on the outer edge of the liquid crystal panel 11 to be exposed in a front side 10a of the liquid crystal panel unit 10. The liquid crystal panel unit 10 includes a pair of signal processing circuit boards (two printed circuit boards of a source circuit board and a gate circuit board) 13 and 14 mounted on a back side 10b thereof along a horizontal side and a vertical side respectively.

As the liquid crystal panel unit 10 is reduced in the thickness and the peripheral marginal area, their structure holds a larger area for display hence matching the down sizing and the light weighing of a notebook computer with the liquid crystal display. Preferably, the liquid crystal panel unit 10 may be 4 to 8 mm in the thickness and its effective pixel area may be about 90% of the entire panel surface.

The shield plate 12 is made of a frame-like shaped metal material having an L shape in cross section. The shield plate 12 has an upright wall 12a thereof which extends along the outer edge of the liquid crystal panel 11 to determine an outer edge of the crystal panel unit 10. A variable resistor (VR) 15 of single-side controllable type is mounted on a components mounting side of the signal processing circuit board 13 with its control knob exposed from the back side of the same.

The VR 15 is joined by a flexible printed circuit (FPC) 16 to the signal processing circuit board 13 and its control knob is exposed from the back side 10b of the liquid crystal panel unit 10. The VR 15 can hence be adjusted to a desired level of resistance by an adjusting tool, such as a screwdriver, engaging and turning its control knob.

FIG. 4 is an exploded view of a liquid crystal module including the liquid crystal panel shown in FIGS. 3A to 3C. As shown in FIG. 4, the liquid crystal module 17 consists mainly of the liquid crystal panel 10, the shield plate 12, and a back light unit 18. The liquid crystal panel unit 10 is sandwiched from both sides between the shield plate 12 and the back light unit 18 and assembled together, to form the liquid crystal module 17.

The paired signal processing circuit boards 13 and 14 are mounted along a long edge and a short edge respectively on the liquid crystal panel 11 of the liquid crystal panel unit 10. A plurality of tape carrier packages (TCPs) 19 of driver integral circuits (IC) are provided to one of long sides of the signal processing circuit board 13 along the long side. Similarly, a plurality of tape carrier packages (TCPs) 20 of driver integral circuits (IC) are provided to one of long sides of the signal processing circuit board 14 along the long side.

The TCP 19 and the TCP 20 join the signal processing circuit boards 13 and 14 respectively to the liquid crystal panel 11. Accordingly, the two signal processing circuit boards 13 and 14 can be folded down onto the back side of the liquid crystal panel 11 at their respective TCPs 19 and 20 (See FIG. 3B).

The back light unit 18 includes a light guiding plate 22, a light diffusing sheet 23, a light reflecting sheet 29, and a back light module 24 joined to one another to have a rectangular unit (FIG. 5). A lamp (not shown) is installed in a lowermost region of the light guiding plate 22. A lamp cable 25 extends from one end of the lowermost region which is connected at a distal end with a connector 25a. The light guiding plate 22, the light diffusing sheet 23, and the light reflecting sheet 29 are bonded in layer relationship and fixedly joined at the outer edge with the back light module 24.

FIG. 5 is a longitudinal cross sectional view showing an internal arrangement of the liquid crystal module 17. As shown in FIG. 5, the liquid crystal module 17 has a layer arrangement where placed one over the other in an order, from the liquid crystal display screen or the front side 10a of the liquid crystal panel unit 10 to the signal processing circuit board 13, are the liquid crystal panel 11 which includes four layers of a polarizing plate 26a, an opposite substrate 27, a thin film transistor (TFT) substrate 28, and another polarizing plate 26b, the light guiding plate 22, the light reflecting sheet 29, and the signal processing circuit board 13.

The signal processing circuit board 13 includes the VR 15, a variable capacitor, a resistor, a capacitor and other circuitry components which are not shown in FIG. 5, in addition to the driver IC, resistors, and capacitors and the like.

The liquid crystal module 17 is protected at the outer edge with the shield plate 12 extending over the back light mold 24. A lamp 30 is provided along the lowermost part 22b of the light guiding plate 22. The light guiding plate 22 is arranged of a tapered cross section which becomes gradually thicker from the upper end to the lower end. The back side of the light guiding plate 22 is spaced by a small gap 40 from the signal processing circuit board 13. The small gap 40 is developed and maintained by the thickness of the back light mold 24 provided above for accepting some components.

The TCP 19 mounted at the uppermost of the signal processing circuit board 13 has a front end 19a thereof extending in an arc-shape and along the outer edge of the back light mold 24 and connected with the TFT substrate 28 of the liquid crystal panel 11.

Figure 6A:
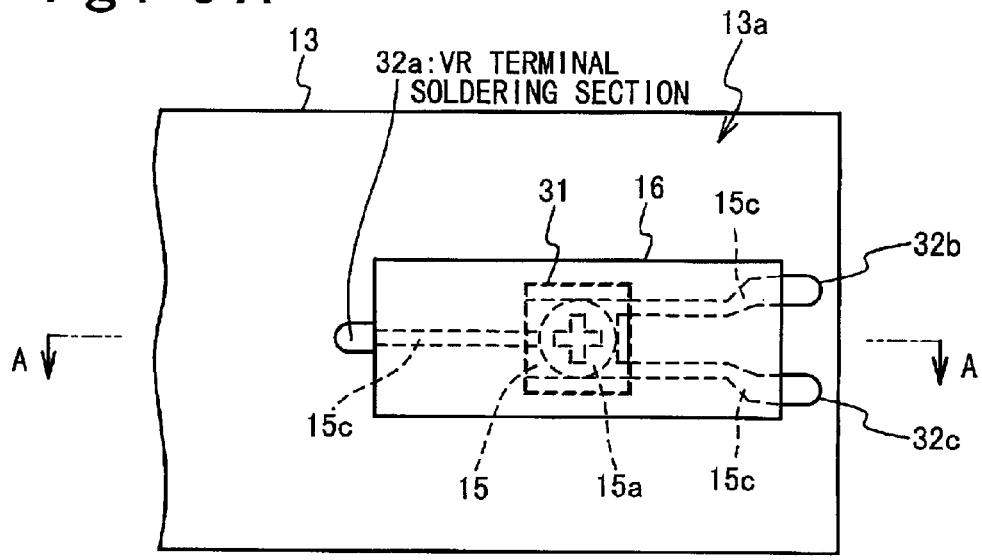
FIG. 6A is a plan view showing a portion of the components mounting side of the signal processing circuit board of the embodiment on which a VR is mounted.
Figure 6B:
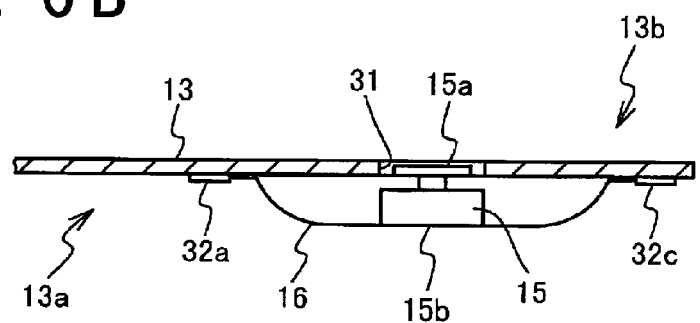
FIG. 6B is a cross sectional view taken along the line A—A of FIG. 6A.

FIG. 6A is a plan view showing a portion of the components mounting side 13a of the signal processing substrate 13 on which the VR 15 is mounted. FIG. 6B is a cross sectional view taken along the line A—A of FIG. 6A. FIG.

6C is a plan view showing a portion of the back side 13b of the signal processing circuit board 13 on which the VR 15 is mounted.

Figure 6C:
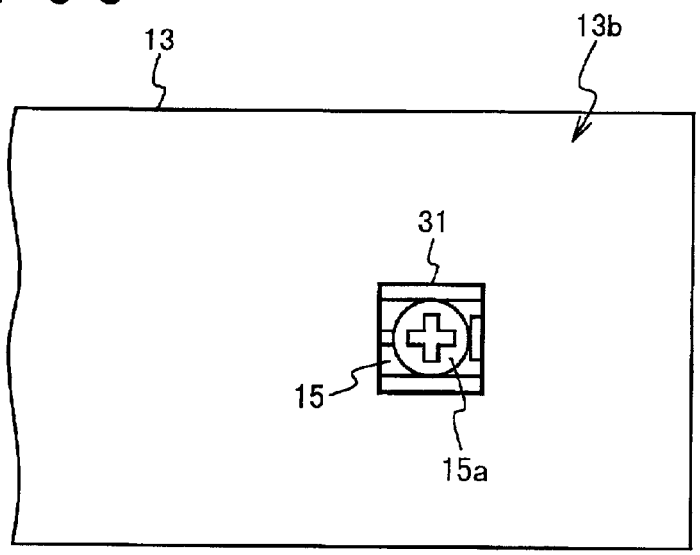
FIG. 6C is a plan view showing a portion of the back side of the signal processing circuit board of the embodiment on which the VR is mounted.

As shown in FIGS. 6A to 6C, the VR 15 is mounted at a particular location on the components mounting side 13a of the signal processing circuit board 13 which thus has a VR adjusting opening 31 (e.g. of a rectangular shape) provided therein for access to the VR 15.

The VR adjusting opening 31 is shaped to a minimum size suited for avoiding the VR 15 from being damaged by the adjusting tool during the adjusting process and allowing its control knob 15a to be manipulated by the adjusting tool without difficulty while being free from the signal processing circuit board 13 (See FIGS. 6B and 6C). The size of the VR adjusting opening 31 may be equal to a sum of the size of the control knob 15a of the VR 15 and a discrepancy from of the installable area of the VR 15.

The VR 15 is not directly joined to the signal processing circuit board 13 but mounted on the FPC 16, which exhibits a level of flexibility against the applied stress as is spaced above from the signal processing circuit board 13 (FIG. 6B). The control knob 15a of the VR 15 faces the VR adjusting opening 31 and points in the direction of the back side 13b of the signal processing circuit board 13 opposite to the components mounting side 13a (FIGS. 6B and 6C).

The FPC 16 has a rectangular shape which is greater in the size than the mounting side 15b facing opposite to the control knob 15a of the VR 15. The VR 15 is fixedly joined at its mounting side 15a to substantially the center of the FPC 16. The FPC 16 is in turn joined to the components mounting side 13a of the signal processing circuit board 13 so as to shut off the VR adjusting opening 31 entirely. More particularly, the FPC 16 carrying the VR 15 is soldered at its edge to the components mounting side 13a of the signal processing circuit board 13 by three VR terminal soldering sections 32a, 32b, and 32c which are connected to connection terminals 15c of the VR 15 respectively (FIGS. 6A and 6B).

The VR terminal soldering section 32a is located at substantially the center of one end of the FPC 16 while the other two VR terminal solders 32b and 32c are located at two different locations of the other end of the FPC 16 respectively which are equally spaced from the center of the same.

As shown in FIG. 6B, when the FPC 16 is soldered by the VR terminal solders 32a, 32b, and 32c to the components mounting side 13a of the signal processing circuit board 13, the FPC 16 is formed such that the control knob 15a of the VR 15 is supported so as not to project from the VR adjusting opening 31 in the direction of the back side 13b.

More specifically, the FPC 16 bent to a predetermined shape by forming process holds the VR 15 in the VR adjusting opening 31 so that its control knob 15a is flush with the back side 13b of the signal processing circuit board 13. The FPC 16 may preferably be made of a sheet material which can easily be shaped by any known forming process.

The function of the FPC 16 hence includes electrical and mechanical connection of the VR 15 to the signal processing circuit boards 13, leveling the VR 15 with the signal processing circuit board 13, and serving as a resistor mounting member, hence contributing to the minimum thickness of the liquid panel unit 10 on which the signal processing circuit board 13 is mounted and thus of the liquid crystal display.

Figure 7A:
FIG. 7A is a cross sectional view explaining a step for mounting the VR on the signal processing circuit board shown in FIGS. 6A to 6C.
Figure 7B:
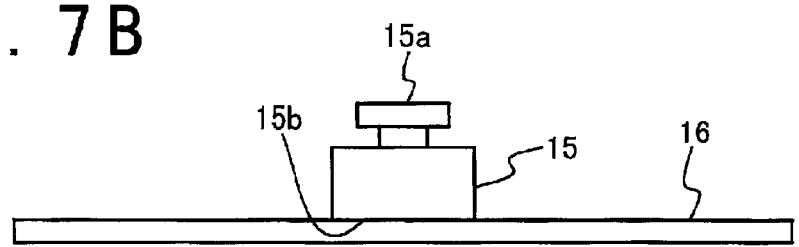
FIG. 7B is a cross sectional view explaining another step for mounting the VR on the signal processing circuit board shown in FIGS. 6A to 6C.
Figure 7C:
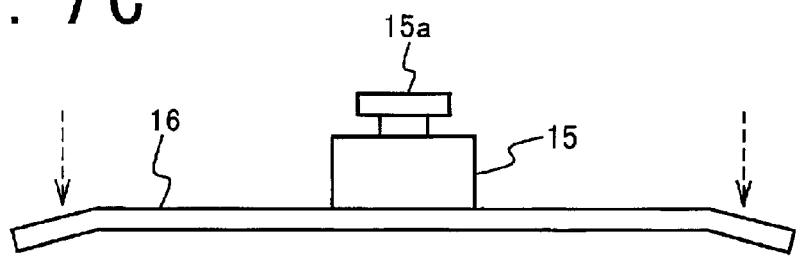
FIG. 7C is a cross sectional view explaining a further step for mounting the VR on the signal processing circuit board shown in FIGS. 6A to 6C.

FIGS. 7A to 7E are cross sectional views explaining a procedure of mounting the VR onto the signal processing circuit board shown in FIGS. 6A to 6C. Referring to FIGS. 7A to 7C, the VR 15 is first mounted on the FPC 16 (FIG. 7A) with its mounting side 15b down (FIG. 7B). Then, both ends of the FPC 16 are lightly bent until they tilts downwardly at an angle (FIG. 7C).

Figure 7D:
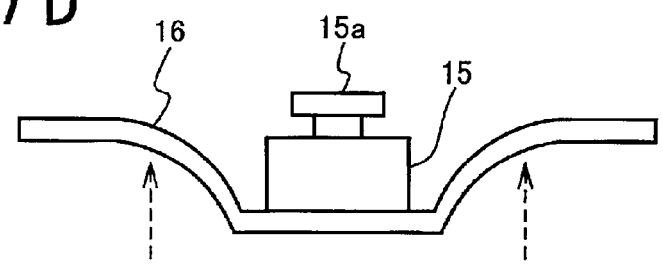
FIG. 7D is a cross sectional view explaining a still further step for mounting the VR on the signal processing circuit board shown in FIGS. 6A to 6C.
Figure 7E:
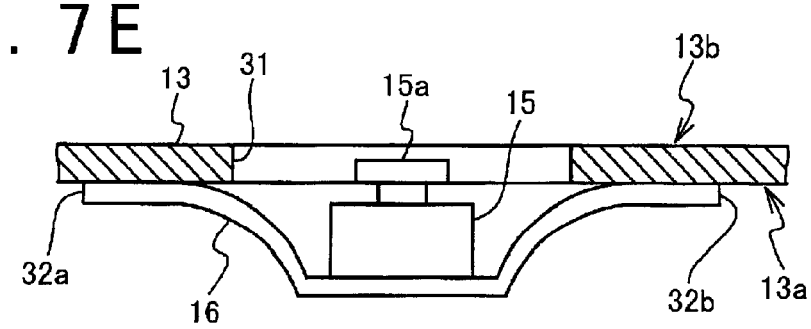
FIG. 7E is a cross sectional view explaining a still further step for mounting the VR on the signal processing circuit board shown in FIGS. 6A to 6C.

The FPC 16 is then subjected to the forming process where its two regions on both sides of the VR 15 are curved upwardly, leaving the two ends leveled with the VR 15 (FIG. 7D). The formed FPC 16 is supported beneath the signal processing circuit board 13 with the control knob 15a of the VR 15 positioned just in the VR adjusting opening 31 and soldered at both ends to the components mounting side 13a of the signal processing circuit board 13. The mounting of the FPC 16 on the signal processing circuit board 13 is now completed.

During the forming process of the FPC 16, care should be taken so that the control knob 15a of the VR 15 mounted thereon stays in the VR adjusting opening 31 but not projects upwardly from the back side 13b of the signal processing circuit board 13.

As described above, the FPC 16 mounted to the signal processing circuit board 13 allows the control knob 15a of the VR 15 to be exposed at the VR adjusting opening 31 from the back side, opposite to the display side, of the liquid crystal module 17. The control knob 15a can easily be accessed and controlled by an adjusting tool, such as a screwdriver, inserting from the back side of the liquid crystal module 17 into the VR adjusting opening 31. More particularly, the VR 15 can be adjusted to a desired level of resistance with the adjusting tool for determining the optimum supply potential while observing the display of the liquid crystal module 17.

Also, the FPC 16 is selected from flexible materials of a thickness which can be bent in a short stroke for inhibiting declination of the efficiency of the mounting process and can bear a stress (of pressure and turning) during the VR adjustment while the VR 15 is of single-side controllable type.

The VR 15 of single-side controllable type which is lower in the height is mounted on the FPC 16 and located in the VR adjusting opening 31 provided in the signal processing circuit board 13 of the liquid crystal panel 11 in the liquid crystal display. This permits the VR 15 to be accessed and controlled from the back side opposite to the components mounting side of the signal processing circuit board 13 or the back side of the liquid crystal display for adjusting the supply potential to an optimum level.

Also, as the VR 15 is mounted on the FPC 16, it can be protected from being intensively stressed during the adjustment of resistance of the VR 15 by the flexibility of the FPC 16. While the VR 15 is inhibited from being injured, the direct transmission of stress to the back light unit 18 can favorably be avoided and the performance of the liquid crystal display will be ensured without declining its image quality.

Figure 2A:
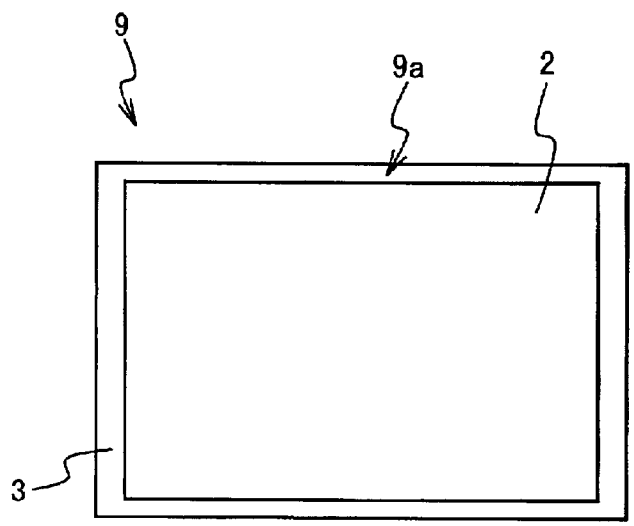
FIG. 2A is a front view showing a liquid crystal panel unit employing another conventional signal processing circuit board.
Figure 2C:
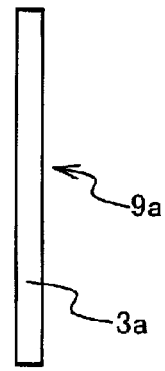
FIG. 2C is a side view showing the liquid crystal panel unit employing the another conventional signal processing circuit board.
Figure 2B:
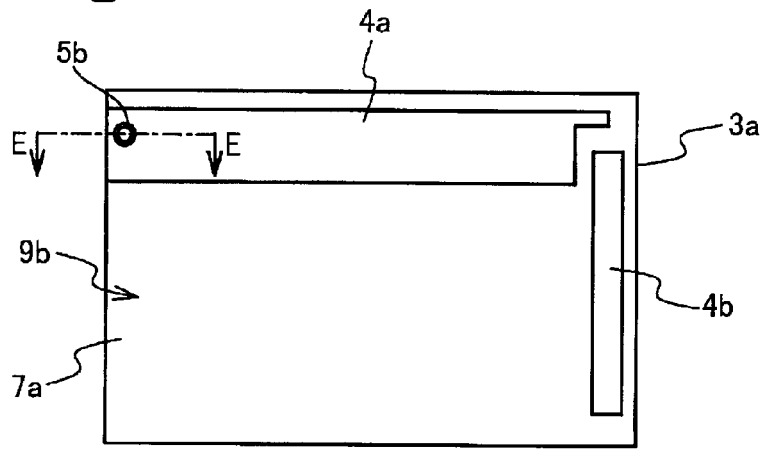
FIG. 2B is a back view showing the liquid crystal panel unit employing the another conventional signal processing circuit board.
Figure 2D:
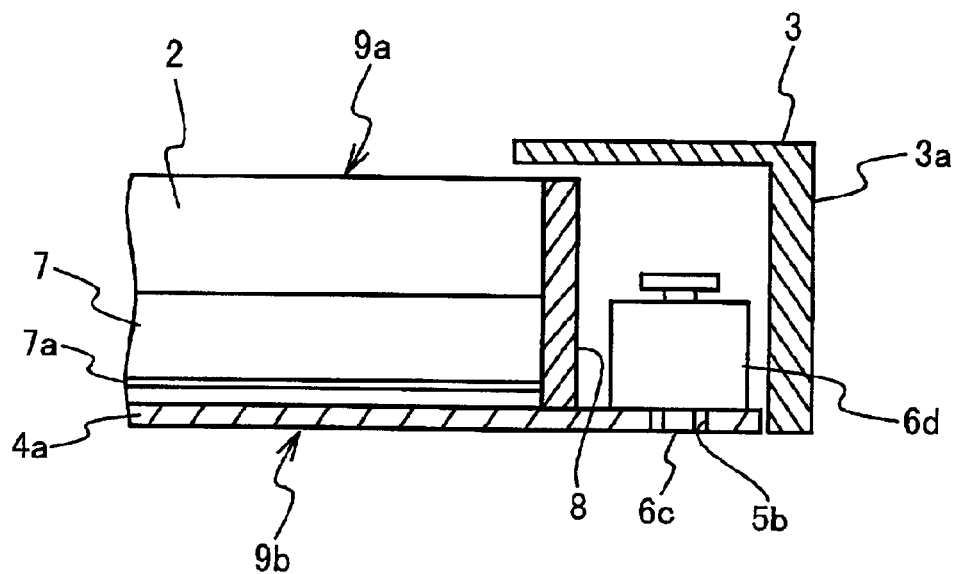
FIG. 2D is a cross sectional view taken along the line E—E of FIG. 2A.
Figure 2E:
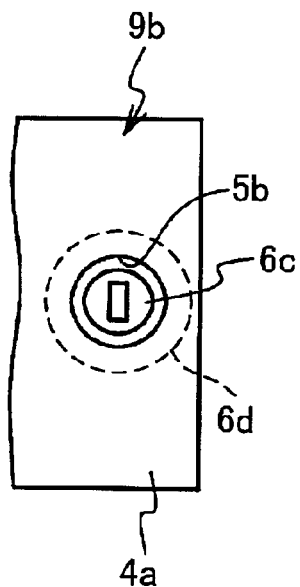
FIG. 2E is an enlarged view of a VR mounting region shown in FIG. 2A.

The VR 15 is mounted as overlapped with the liquid crystal panel 11 and its installation is not limited by the back light chassis (See FIGS. 1D and 2D). Since the VR 15 is enabled to sit at any location where its room or space is provided, the freedom for designing the signal processing circuit board 13 can significantly be increased.

The signal processing circuit board on which the VR 15 is mounted with some modifications will now be described referring to FIGS. 8A to 8D.

Figure 8A:
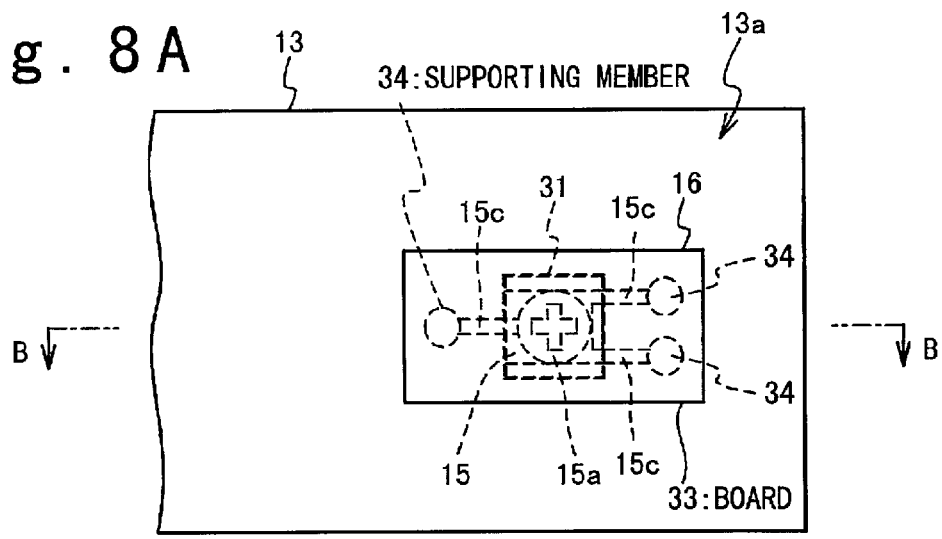
FIG. 8A is a plan view showing a portion of the components mounting side of the signal processing circuit board of the embodiment on which the VR is mounted with modifications.
Figure 8B:
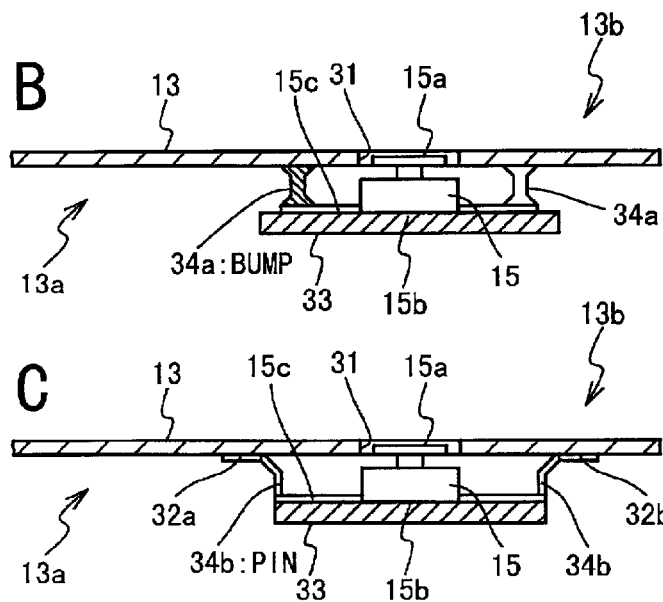
FIG. 8B is a cross sectional view taken along the line B—B of FIG. 8A showing one modification.

FIG. 8A is a plan view showing a portion of the components mounting side of the signal processing circuit board on which the VR is mounted with the some modifications. FIG.

Figure 8C:
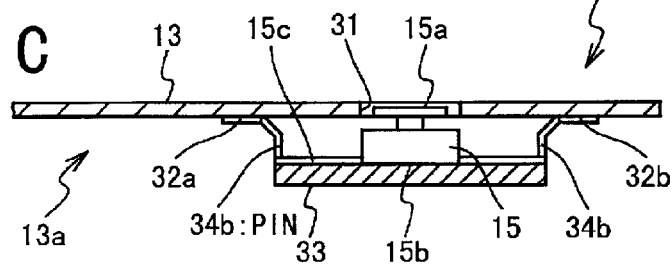
FIG. 8C is a cross sectional view taken along the line B—B of FIG. 8A showing another modification.
Figure 8D:
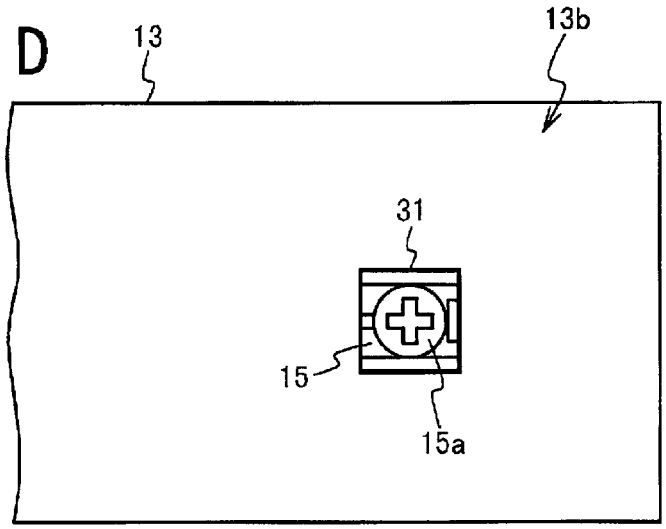
FIG. 8D is a plan view showing a portion of the back side of the signal processing circuit board of the embodiment on which the VR is mounted with the modifications.

8B is a cross sectional view taken along the line B—B of FIG. 8A showing one modification. FIG. 8C is a cross sectional view taken along the line B—B of FIG. 8A showing another modification. FIG. 8D is a plan view showing a portion of the back side of the signal processing circuit board.

As shown in FIGS. 8A to 8D, this arrangement and function is identical to that shown in FIGS. 6A to 6C, except that the VR 15 is mounted to the signal processing circuit board 13 by a combination of a board 33 and supporting member 34 which replace the FPC 16.

The board 33 may be made of the same material as of the signal processing circuit board 13. The board 33 on which the VR 15 is mounted at its mounting side 15b is joined to the components mounting side 13a of the signal processing circuit board 13 by the pillar- or wall-like supporting member 34 which are arranged of, for example, a bump 34a (FIG. 8B) or a pin 34b (FIG. 8C) made of a conductive material. The supporting member 34 of the bump 34a are directly solder to or the supporting member 34 of the pin 34b are soldered by VR terminal solders 32a, 32b, and 32c to the components mounting side 13a.

The signal processing circuit board on which the VR 15 is mounted with further modifications will be described referring to FIGS. 9A to 9D.

Figure 9A:
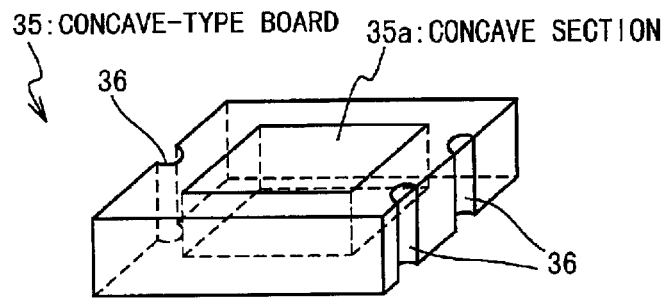
FIG. 9A is an overall perspective view of a recessed block showing a still further modification.
Figure 9B:
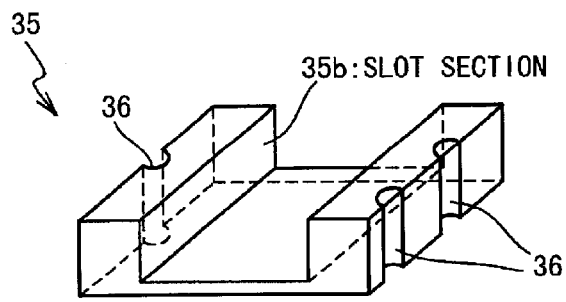
FIG. 9B is an overall perspective view of another form of the recessed block showing a still further modification.
Figure 9C:
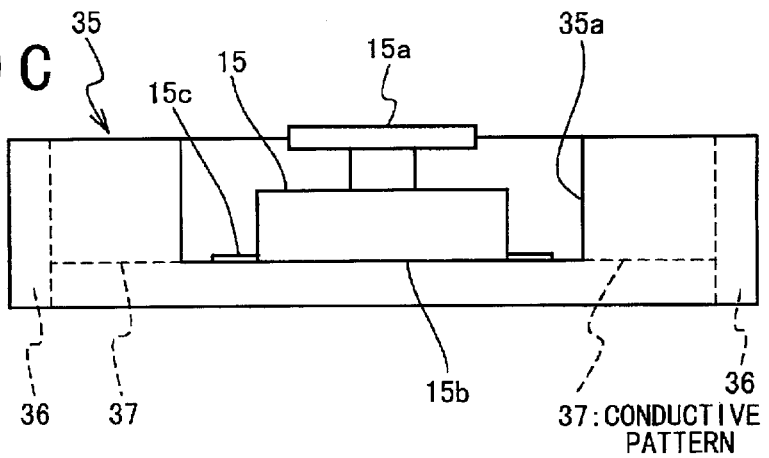
FIG. 9C is a cross sectional view showing the VR mounted on the recessed block of the still further modification.
Figure 9D:
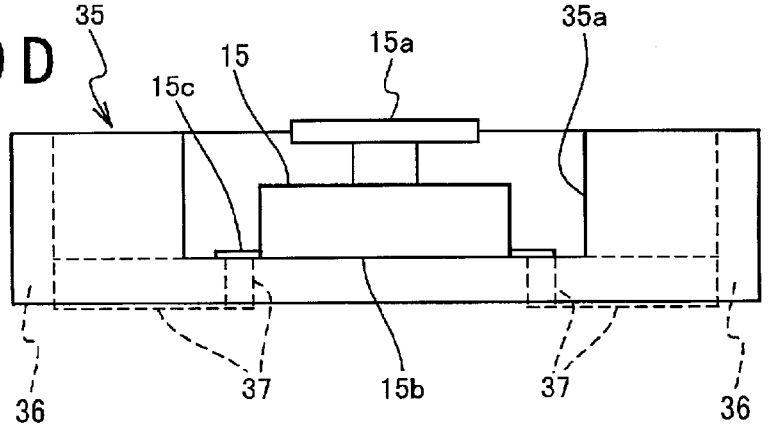
FIG. 9D is a cross sectional view showing the VR mounted on the another form of the recessed block of the still further modification.

FIG. 9A is an overall perspective view of a recessed block showing one modification. FIG. 9B is an overall perspective view of another form of the recessed block. FIG. 9C is a cross sectional view of the VR mounted on the recessed block. FIG. 9d is a cross sectional view of the VR mounted on the another form of the recessed block. As shown in FIGS. 9A to 9D, this arrangement and function is identical to that shown in FIGS. 6A to 6C, except that the VR 15 is mounted on the signal processing circuit board 13 by the concave-type board 35 which replaces the FPC 16.

The concave-type board 35 may be made of the same material as of the signal processing circuit board 13. The concave-type board 35 has a (installation) concave section 35a provided in the center thereof for installation of the VR 15 and three vertical flutes 36 provided in both sides thereof for electrical and mechanical connection with the signal processing circuit board 13 (FIG. 9A). The concave section 35a may be replaced by a slot section 35b with a pair of opposite side walls eliminated (FIG. 9B). The number of the vertical flutes 36 is not limited to three but may be more if desired. The concave-type board 35 may be formed of a single board or a number of layers.

Before mounting the VR 15 on the concave-type board 35, a conductive pattern 37 is provided on the bottom of the concave section 35a for connecting connection terminals 15c of the VR 15 to the components mounting side 13a of the signal processing circuit board 13 (FIG. 9C). The conductive pattern 37 may be provided on the back side of the concave-type board 35 as extended from the concave section 35a (FIG. 9D).

Figure 10A:
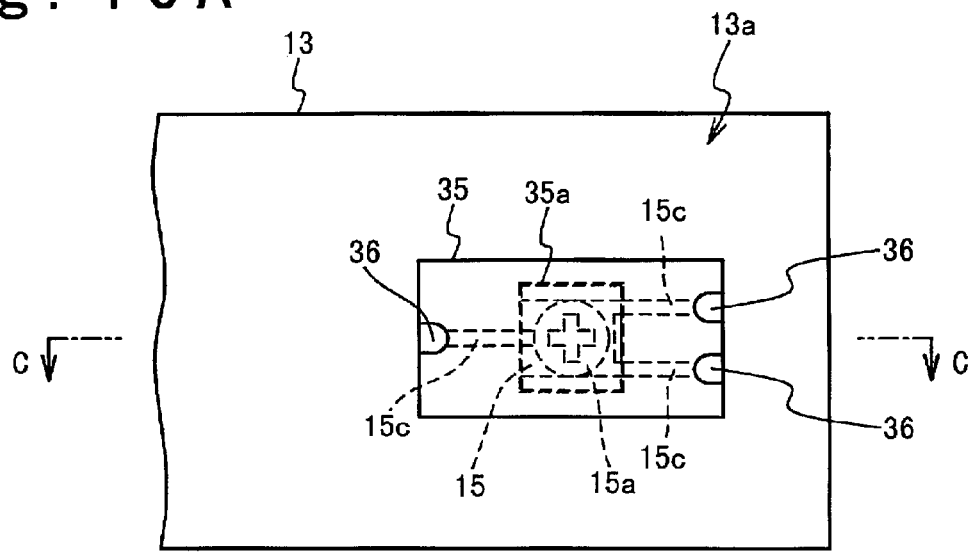
FIG. 10A is a plan view showing a portion of the components mounting side of the signal processing circuit board of the embodiment on which the VR is mounted by the recessed block shown in FIGS. 9A to 9D.
Figure 10B:
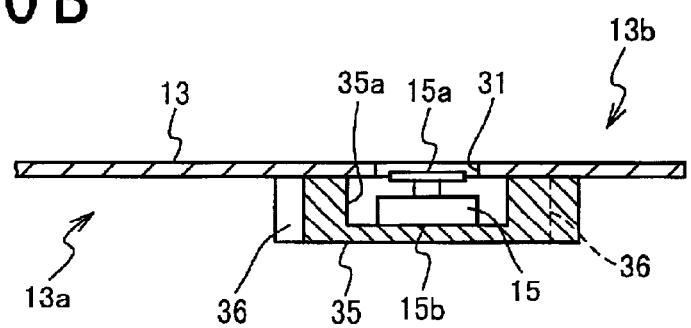
FIG. 10B is a cross sectional view taken along the line C—C of FIG. 10A.
Figure 10C:
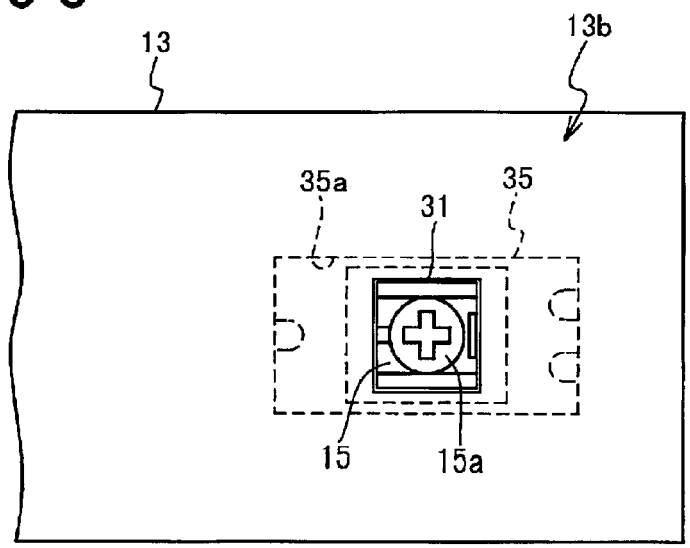
FIG. 10C is a plan view showing a portion of the back side of the signal processing circuit board of the embodiment on which the VR is mounted by the recessed block shown in FIGS. 9A to 9D.

FIG. 10A is a plan view showing a portion of the components mounting side of the signal processing circuit board 13 where the VR 15 is mounted by the recessed block shown in FIGS. 9A to 9D. FIG. 10B is a cross sectional view taken along the line C—C of FIG. 10A. FIG. 10C is a plan view showing a portion of the back side of the signal processing circuit board 13 where the VR 15 is mounted by the recessed block shown in FIGS. 9A to 9D.

As shown in FIGS. 10A to 10C, the concave-type board 35 is joined at its vertical flutes 36 by soldering to the signal processing circuit board 13.

According to the embodiments, the VF 15 of single-side controllable type which is shorter in the height than the double-side controllable type and lower in price is enabled to sit on the signal processing circuit board 13 of the liquid crystal panel 11 of a liquid crystal display, such as a notebook computer, having basically a thin, frame-narrowed arrangement and can favorably be adjusted while observing the display.

Also, as the VR 15 is mounted by the FPC 16 to the signal processing circuit board 13, it can be protected from being intensively stressed during the adjustment of resistance by the flexibility of the FPC 16 which also dissipates the stress to the signal processing circuit board 13. This will minimize the injury of the VR 15 and the fracture of the FPC 16. As the VR 15 of single-side controllable type is low in the height and its control knob 15a stays in the VR adjusting opening 31 provided in the signal processing circuit board 13 but not exceeding the thickness of the board (FIG. 6B), the installation of the VR can be decreased in the overall height.

Since the height of the VR which is a major target to be tackled for minimizing the overall thickness and implementing the frame-narrowed structure is decreased, such tall, troubled components are eliminated and the minimizing the overall thickness and the implementing the frame-narrowed arrangement can be accelerated. The VR 15 on the signal processing circuit board 13 remains not projected outwardly of the back side of the board (FIG. 6B), hence preventing any event of injury by the physical collision or short-circuit by the electrical contact at the back side of the signal processing circuit board 13 during the assembling process of the liquid crystal panel unit 10 at either the manufacturer's plant or the client's workshop.

While being free from preparing a particularly raised VR mounting area off the shield plate 3 or at an edge region thereof so that the VR 15 does not overlap the liquid crystal panel 11, the signal processing circuit board 13 is arranged of a simple rectangular shape without extensions thus decreasing the margin of a material and contributing to the cost down of the overall assembly.

This allows the liquid crystal display to be minimized in the height of components mounted on the signal processing circuit board 13 while its effective area in the overall display surface remaining wide and its structure remaining narrow in the marginal area, hence decreasing the overall thickness and the cost of production. Also, the adjustment on the VR can be manipulated from the back side of the signal processing circuit board 13 or of the liquid crystal display. As the control knob 15a of the VR 15 is highly visible and accessible in the VR adjusting opening 31, its adjusting action can be improved in the efficiency. In particular, when different types or sizes of the display are flexibly manufactured on a single production line, the above mentioned advantage will be more emphasized.

The use of the FPC 16 is also advantageous. This permits the bump 34a which may hardly be controlled in the size along the vertical direction to be favorably employed under appropriate control. If the pin 34b is selected, any conventional manner requires three consecutive steps for mounting the VR 15 to the board 33, mounting the pins 34b to the board 33, and mounting the pins 34b to the signal processing circuit board 13. Using the FPC 16, the procedure may duly be replaced by two steps or mounting the VR 15 to the FPC 16 and mounting the FPC 16 to the signal processing circuit board 13.

When the concave-type board 35 is used, its fabrication is not an easy task and requires steps of seat preparation and bonding multiple layers to form a layer structure. The FPC 16 can readily be fabricated by punching process. The FPC 16 is flexible enough as compared with the bumps 34a the pins 34b, and the concave-type board 35 and can hardly be fractured because it absorbs a force of impact developed by the adjusting too.

The mounting of the component on the signal processing circuit board 13 is not limited to the VR 15 but any other similar component, such as a variable capacitor of single-side controllable type, may successfully be mounted on the signal processing circuit board 13 by the foregoing manner.

While the VR 15 is mounted on the signal processing circuit board 13 throughout the embodiments, it may be mounted on the signal processing circuit board 14 or another substrate (not shown) for controlling different voltages which are applied for operating the liquid crystal display.

As set forth above, the present invention allows the variable resistor of single-side controllable type having a control knob thereof on single side to be mounted on the components mounting side of the signal processing circuit board with its control knob locating in the adjusting aperture provided in the signal processing circuit board to open at the components mounting side and simultaneously facing in a direction opposite to the components mounting side. Accordingly, the variable resistor installed in a liquid crystal display panel of a thin, frame-narrowed structure can favorably be mounted at a proper location without unnecessary limitation and protected from being injured during the assembling process without declining the mechanical strength because the shield plate and the chassis have not openings nor notches.

The liquid crystal display apparatus of the present invention can be implemented using the signal processing circuit board described above.

What is claimed is:

1. A liquid crystal display apparatus controlling method, comprising:
   providing a liquid crystal display screen;
   providing a board used for said liquid crystal display screen fixedly attached to said liquid crystal display screen;
   providing a variable electronic element mounted in a mounting side of said board, said variable electronic element having an operating member to control an output outputted from said variable electronic element in a single aide of said variable electronic element;
   forming a hole in said board;
   positioning said operating member in said hole such that said operating member points in the other side opposite to said mounting side of said board, said other side being opposite to said liquid crystal display screen;
   displaying an image on said liquid crystal display screen; and
   operating said operating member through said hole from said other side while viewing said image.

2. The liquid crystal display apparatus controlling method according to claim 1, wherein said operating member does not project from said other side.

3. The liquid crystal display apparatus controlling method according to claim 1, wherein said variable electronic element is mounted through a flexible printed circuit electronically and mechanically connected to said mounting side.

4. The liquid crystal display apparatus controlling method according to claim 3, wherein said flexible printed circuit covers said bole.

5. The liquid crystal display apparatus controlling method according to claim 3, wherein said variable electronic element is floated on said flexible printed circuit.

6. The liquid crystal display apparatus controlling method according to claim 3, wherein said flexible printed circuit has a flexibility to protect said variable electronic element from mechanical stress when said operating member is operated such that said mechanical stress is not applied to said liquid crystal display screen.

7. The liquid crystal display apparatus controlling method according to claim 1, wherein said variable electronic element is provided to overlap with said liquid crystal display screen.

8. A liquid crystal display apparatus, comprising:
   a signal processing circuit board; and
   a liquid crystal display screen electronically and fixedly connected to said signal processing circuit board, an image being displayed on a displaying side of said liquid crystal display screen, and
   wherein said signal processing circuit board includes:
   a board body;
   a variable electronic element mounted in a mounting side of said board body, said variable electronic element having an operating member to control an output outputted from said variable electronic element in a single side of said variable electronic element; and
   a hole provided in said board body, and
   wherein said operating member is positioned in said hole such that said operating member paints in the other side opposite to said mounting side of said board body, and
   wherein said variable electronic element is provided in an opposed side opposed to said displaying side of said liquid crystal display screen such that said operating member is exposed in said opposed side through said hole.

9. The liquid crystal display apparatus according to claim 8, wherein said variable electronic element is mounted through an attachment member electronically and mechanically connected to said mounting side.

10. The liquid crystal display apparatus according to claim 9, wherein said attachment member is a flexible printed circuit connected to said mounting side to cover said hole.

11. The liquid crystal display apparatus according to claim 9, wherein said attachment member includes a strip on which said variable electronic element is mounted and a supporting member to attach to said mounting side.

12. The liquid crystal display apparatus according to claim 9, wherein said attachment member includes a recessed block having a recess in which said variable electronic element is mounted.

13. A liquid crystal display apparatus comprising:
   a liquid crystal display screen;
   a signal processing circuit board electrically connected to said display screen and comprising a board body having a hole therethrough;
   an attachment member fixedly attached only to said circuit board and only at a first side of said circuit board; and
   a variable electronic element connected to said attachment member and having an operating member, said operating member being accessible through said hole from a second side of said circuit board.

14. The liquid crystal display apparatus as claimed in claim 13, wherein said attachment member comprises a flexible printed circuit.

15. The liquid crystal display apparatus as claimed in claim 13, wherein said attachment member comprises a strip and a one of a conductive bump and a conductive pin connecting the strip to said circuit board.

16. The liquid crystal display apparatus as claimed in claim 13, wherein said attachment member comprises a recessed block, said variable electronic element being housed therein.

17. The liquid crystal display apparatus as claimed in claim 13, wherein said attachment member is structured and arranged to electrically and mechanically connect said circuit board to said variable electronic element.

18. The liquid crystal display apparatus as claimed in claim 13, wherein said variable electronic element comprises a variable resistor.

19. The liquid crystal display apparatus as claimed in claim 13, wherein said variable electronic element comprises a variable capacitor.

20. The liquid crystal display apparatus as claimed in claim 13, wherein a top surface of said operating member is substantially flush with said second side.

* * * * *

UNITED STATES PATENT AND TRADEMARK OFFICE
CERTIFICATE OF CORRECTION

PATENT NO. : 6,853,409 B2
DATED : February 8, 2005
INVENTOR(S) : Yutaka Takeishi It is certified that error appears in the above-identified patent and that said Letters Patent is hereby corrected as shown below:

<u>Title page,</u>
Item [73], Assignee, add as follows:
-- [73] Assignee: NEC LCD Technologies, Ltd., Kanagawa (JP) --.

Signed and Sealed this

Fourteenth Day of June, 2005

JON W. DUDAS
*Director of the United States Patent and Trademark Office*